US012764995B2

(12) United States Patent
Pandey et al.

(10) Patent No.: US 12,764,995 B2
(45) Date of Patent: Oct. 13, 2026

(54) SEMICONDUCTOR STRUCTURE WITH DEVICE INCLUDING AT LEAST ONE IN-WELL POROUS REGION

(71) Applicant: GlobalFoundries U.S. Inc., Malta, NY (US)

(72) Inventors: Shesh Mani Pandey, Saratoga Springs, NY (US); Kaustubh Shanbhag, Slingerlands, NY (US); Rajendran Krishnasamy, Essex Junction, VT (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 552 days.

(21) Appl. No.: 18/171,765

(22) Filed: Feb. 21, 2023

(65) Prior Publication Data

US 2024/0282852 A1 Aug. 22, 2024

(51) Int. Cl.
*H10P 50/00* (2026.01)
*H10D 30/01* (2025.01)
(Continued)

(52) U.S. Cl.
CPC ......... *H10D 30/65* (2025.01); *H10D 30/0281* (2025.01); *H10D 62/113* (2025.01); *H10P 50/642* (2026.01); *H10P 50/691* (2026.01)

(58) Field of Classification Search
CPC .. H10D 30/65; H10D 30/0281; H10D 62/113; H10D 30/603; H10D 30/0221; H10D 30/0212; H10D 62/116; H10D 62/126; H10D 62/83; H10D 62/103; H10D 62/10; H10D 62/124; H01L 21/30604; H01L 21/308
(Continued)

(56) References Cited

U.S. PATENT DOCUMENTS 5,635,419 A 6/1997 Geiss et al.
6,617,656 B2 9/2003 Lee et al.
(Continued)

OTHER PUBLICATIONS

European Search Report for EP Application No. 23204516.1-1211 dated May 15, 2024, 9 pages.
(Continued)

*Primary Examiner* — Sheikh Maruf
(74) *Attorney, Agent, or Firm* — Francois Pagette; Hoffman Warnick LLC

(57) ABSTRACT

Disclosed are embodiments of a structure including a semiconductor layer and a device, which has a well region within the semiconductor layer and at least one porous region within and shallower in depth than the well region. In some embodiments, the device can be a field effect transistor (FET) (e.g., a laterally diffused metal oxide semiconductor field effect transistor (LDMOSFETs)) with a drain drift region that extends through the well region around the porous region(s) to a drain region. The porous region(s) can modify the electric field in this drain drift region, thereby improving device performance. Embodiments can vary with regard to the number, size, shape, configuration, etc. of the porous region(s) within the well region. Also disclosed herein are method embodiments for forming the semiconductor structure.

20 Claims, 11 Drawing Sheets

(51) Int. Cl.
*H10D 30/65* (2025.01)
*H10D 62/10* (2025.01)
*H10P 50/64* (2026.01)

(58) Field of Classification Search
USPC ........................................................ 257/343
See application file for complete search history.

(56) References Cited

U.S. PATENT DOCUMENTS

| | | | | |
|---|---|---|---|---|
| 7,550,803 | B1 * | 6/2009 | Huang | H10D 30/668 257/330 |
| 8,716,791 | B1 * | 5/2014 | Iravani | H10D 30/657 257/397 |
| 8,816,465 | B1 * | 8/2014 | Gardner | H10F 77/90 257/464 |
| 9,153,666 | B1 | 10/2015 | Iravani et al. | |
| 9,450,074 | B1 | 9/2016 | Yang et al. | |
| 9,461,046 | B1 * | 10/2016 | Edwards | H10D 62/151 |
| 9,905,687 | B1 * | 2/2018 | Zhu | H10D 62/151 |
| 10,290,712 | B1 * | 5/2019 | Ciavatti | H10D 62/393 |
| 2004/0173859 | A1 * | 9/2004 | Hao | H10D 30/0221 257/E29.268 |
| 2005/0215011 | A1 * | 9/2005 | Darwish | H10D 30/668 257/E29.066 |
| 2006/0128085 | A1 * | 6/2006 | Shibib | H10D 62/111 257/E29.268 |
| 2008/0246055 | A1 | 10/2008 | Schulze et al. | |
| 2009/0127626 | A1 * | 5/2009 | Zhu | H10D 30/795 257/E21.546 |
| 2009/0140335 | A1 * | 6/2009 | Schneider | H10D 62/151 257/344 |
| 2009/0256200 | A1 * | 10/2009 | Yao | H10D 62/109 257/345 |
| 2011/0284953 | A1 * | 11/2011 | Long | H10D 8/00 257/E21.409 |
| 2013/0248852 | A1 * | 9/2013 | Yokozeki | H10D 30/67 438/479 |
| 2014/0001545 | A1 * | 1/2014 | Yang | H10D 30/0285 257/337 |
| 2015/0171147 | A1 * | 6/2015 | You | H10K 59/1213 438/46 |
| 2016/0093647 | A1 * | 3/2016 | Kim | H10D 30/6723 257/40 |
| 2017/0352756 | A1 * | 12/2017 | Lin | H10D 62/157 |
| 2017/0372985 | A1 * | 12/2017 | Birner | H10D 64/254 |
| 2017/0373187 | A1 * | 12/2017 | Birner | H01L 23/5226 |
| 2018/0061982 | A1 * | 3/2018 | Sambi | H10D 62/53 |
| 2018/0350995 | A1 * | 12/2018 | Kim | H10D 30/6755 |
| 2020/0212076 | A1 * | 7/2020 | Jang | H10D 86/431 |
| 2020/0235200 | A1 * | 7/2020 | Obata | H10D 1/716 |
| 2021/0072304 | A1 * | 3/2021 | Coyne | G01R 31/2623 |
| 2021/0119041 | A1 * | 4/2021 | Ma | H10D 64/516 |
| 2021/0184033 | A1 * | 6/2021 | Coyne | H10D 62/116 |
| 2021/0296513 | A1 * | 9/2021 | Sano | H01L 21/30604 |
| 2022/0052197 | A1 * | 2/2022 | Wada | H10D 30/603 |
| 2022/0059525 | A1 * | 2/2022 | Mahajan | H10D 62/116 |
| 2022/0069081 | A1 * | 3/2022 | Lin | H10D 30/603 |

OTHER PUBLICATIONS

U.S. Appl. No. 18/157,939 Office Action dated Jul. 31, 2025, 22 pages.

U.S. Appl. No. 18/157,939, Amendment to Office Action filed Oct. 6, 2025, 14 pages.

Asif et al., "Ultra-thin flexible 100 V Chipfilm™ N-LDMOS," in Sep. 2011 IEEE Proceedings of the European Solid-State Device Research Conference (ESSDERC), pp. 215-218.

Barkhordarian, "Power MOSEFET Basics," International Rectifier, retrieved from: https://www.infineon.com on Dec. 15, 2022, 13 pages.

Bon et al., "RF Power NLDMOS Technology Transfer Strategy from the 130nm to the 65nm node on this SOI," 2007 IEEE International SOI Conference Proceedings, pp. 61-62.

Fiorenza et al., "A RF Power LDMOS Device on SOI," Oct. 1999, IEEE International SOI Conference, pp. 96-97.

Fiorenza et al., "RF Power LDMOSFET on SOI," IEEE Electron Device Letters, vol. 22, No. 3, Mar. 2001, pp. 139-141.

Gautier et al., "Porous silicon for electrical isolation in radio frequency devices: A review," Applied Physics Reviews 1, 011101, published online Jan. 2, 2014, 19 pages.

Huang et al., "0.18um BCD Technology with Best-in-Class LDMOS from 6 V to 45 V," Proceedings of the 26th International Symposium on Power Semiconductor Devices & IC's, Jun. 15-19, 2014, pp. 179-181.

Luo et al., "Ultralow ON-Resistance Soi Ldmos With Three Separated Gates and High-K Dielectric," IEEE Transactions on Electron Devices, vol. 63, No. 9, Sep. 2016, pp. 3804-3807.

Mai et al., "Cost-Effective Integration of RF-LDMOS Transistors in 0.13μm CMOS Technology," Jan. 2009, IEEE Topical Meeting on Silicon Monolithic Integrated Circuits in RF Systems, 4 pages.

Sailor, "Porous Silicon in Practice: Preparation, Characterization and Applications," First Edition, Published 2012, 42 pages.

Starostina et al., "Porous-Silicon Formation in HF-HNO3-H2O Etchants," Russian Microelectronics, vol. 31, No. 2, 2002, pp. 88-96.

Toh et al., "RF Performance of a Highly Linear Power Amplifier EDNMOS Transistor on Trap-Rich SOI," IEEE Electron Device Letters, vol. 39, No. 9, Sep. 2018, pp. 1346-1349.

Xu et al., "Multi-Gates SOI LDMOS for Improved on-state Performance," Proceedings of the 26th International Symposium on Power Semiconductor Devices & IC's, Jun. 15-19, 2014, pp. 175-178.

European Search Report for corresponding EP Application No. 2319844.1-1212 dated Feb. 13, 2024, 9 pages.

U.S. Appl. No. 18/157,939, filed Jan. 23, 2023, 34 pages.

U.S. Appl. No. 18/157,939, Final Office Action dated Oct. 28, 2025, 25 pages.

U.S. Appl. No. 18/157,939, Response to Final Office Action filed Nov. 26, 2025, 15 pages.

U.S. Appl. No. 18/157,939, Advisory Action dated Dec. 2, 2025, 3 pages.

U.S. Appl. No. 18/157,939, Amendment Submitted with Request for Continued Examination filed Dec. 18, 2025, 16 pages.

* cited by examiner

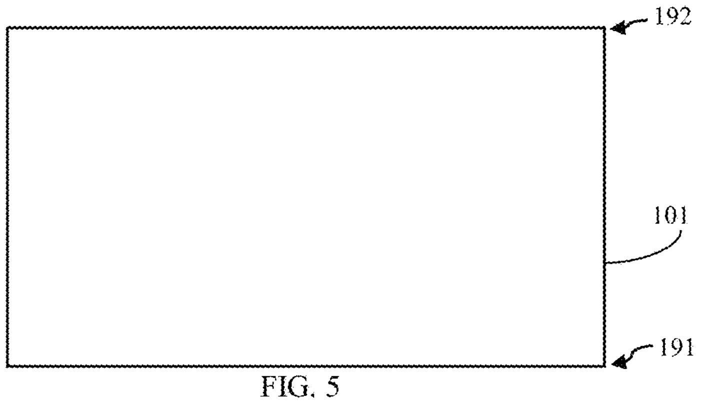
FIG. 5
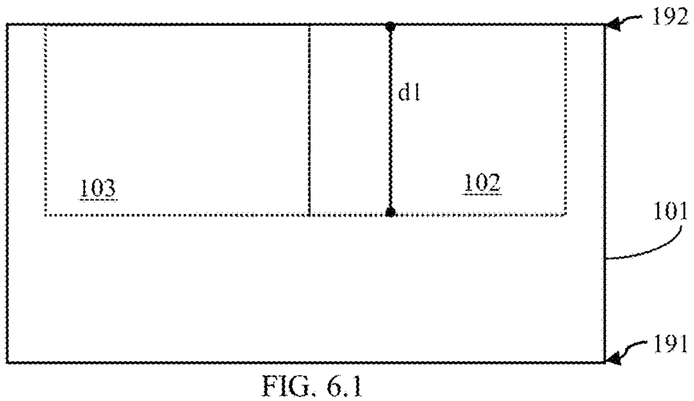
FIG. 6.1
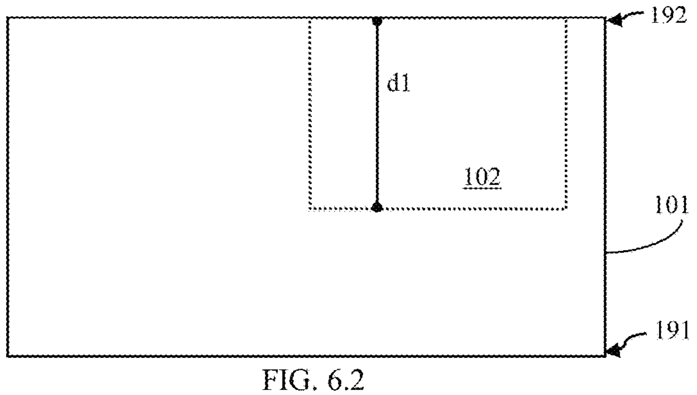
FIG. 6.2
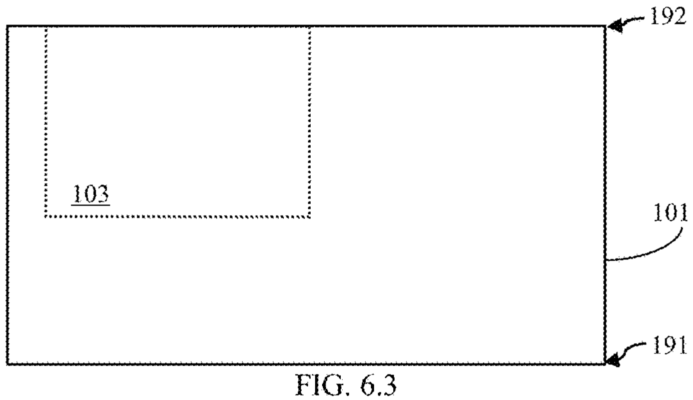
FIG. 6.3

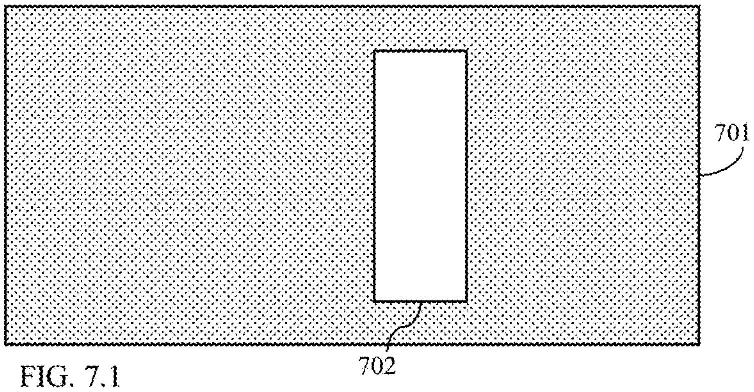
FIG. 7.1
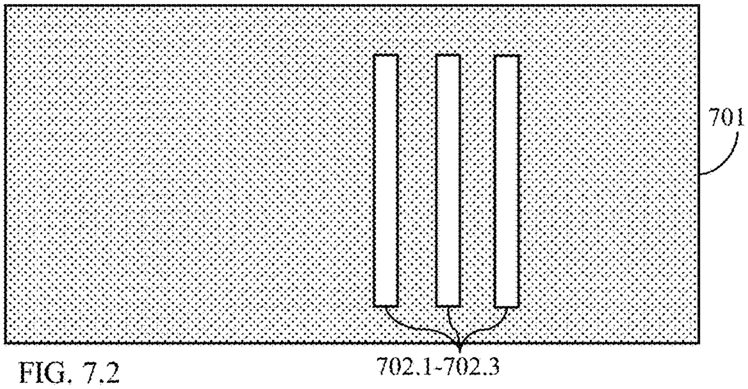
FIG. 7.2
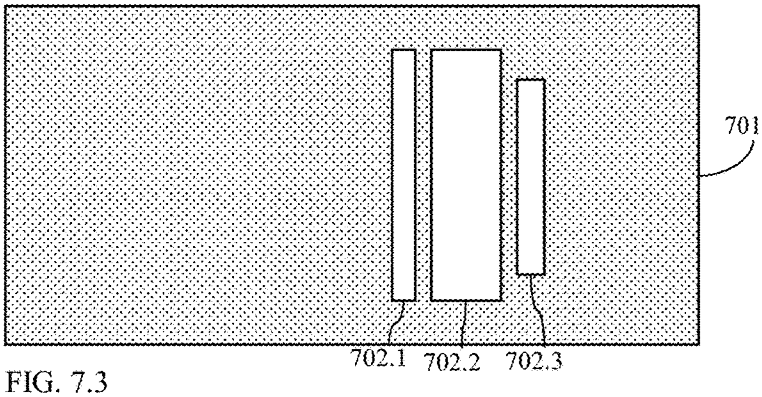
FIG. 7.3
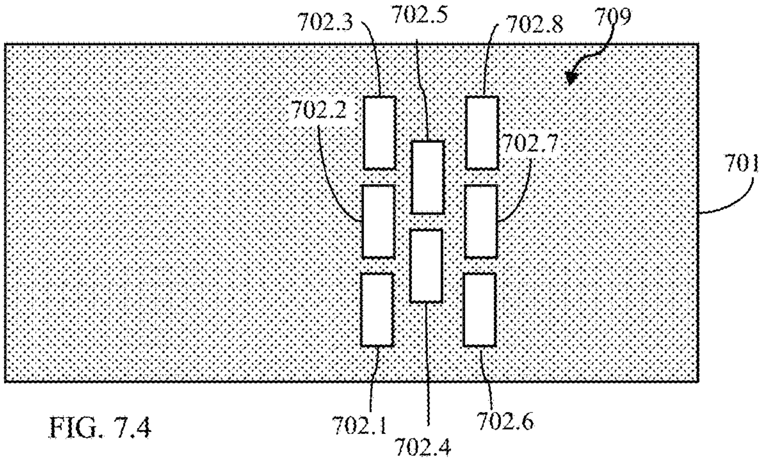
FIG. 7.4

SEMICONDUCTOR STRUCTURE WITH DEVICE INCLUDING AT LEAST ONE IN-WELL POROUS REGION

BACKGROUND

The present disclosure relates to semiconductor structures and, more particularly, to embodiments of a semiconductor structure including a semiconductor device and to embodiments of a method of forming the semiconductor structure.

Factors considered in modern integrated circuit (IC) design include, but are not limited to, performance improvement, size scaling, and power consumption. Oftentimes, however, there is a tradeoff between these factors. For example, laterally diffused metal oxide semiconductor field effect transistors (LDMOSFETs) are widely used in amplifiers, such as radio frequency (RF) amplifiers, microwave power amplifiers, etc., because of their low on-resistance and because, in general, they have a relatively high blocking voltage (also referred to in the art as the drain-to-source breakdown voltage (BVdss)). However, with device size scaling and operation at higher voltages, LDMOSFETs can exhibit performance degradation including, but not limited to, reduced BVdss and reduced transconductance (Gm). BVdss refers to the specific drain-to-source voltage (Vds) that results in the transistor entering the breakdown region at which Vds is too high and the drain current (Id) spikes (i.e., increases dramatically). Gm refers to the ratio of the change in Id to the change in gate voltage (Vg) (i.e., Id2-Id1/Vg2-Vg1) over, for example, some period of time in the I/V curve for the device.

SUMMARY

Disclosed herein are embodiments of a structure. The structure can include a semiconductor layer having a first surface and a second surface opposite the first surface. The structure can further include a device. The device can include a well region within the semiconductor layer and at least one porous region within the well region. Specifically, the well region can extend into the semiconductor layer from the second surface to a first depth and the porous region(s) can extend into the semiconductor layer from the second surface to a second depth shallower than the first depth.

In some of the disclosed embodiments, the device can be, for example, a field effect transistor (e.g., a laterally diffused metal oxide semiconductor field effect transistor (LDMOSFET)). Specifically, the structure can include a semiconductor layer having a first surface and a second surface opposite the first surface. The structure can further include a device. The device can include an active device region in the semiconductor layer. The device can further include a well region in the active device region. The well region can be positioned toward one end of the active device region and can extend into the semiconductor layer from the second surface to a first depth. The device can further include at least one porous region within the well region. The at least one porous region can extend into the semiconductor layer from the second surface to a second depth shallower than the first depth. The device can further include, at opposing ends of the active device region, a source region and a drain region with the drain region being immediately adjacent to the well region and parallel to the at least one porous region.

Also disclosed herein are method embodiments for forming the above-described structures. For example, the method can include providing a semiconductor layer having a first surface and a second surface opposite the first surface. The method can further include forming a device. The device can be formed so that it includes a well region within the semiconductor layer and at least one porous region within the well region. The well region can be extend into the semiconductor layer from the second surface to a first depth and the at least one porous region can extend into the semiconductor layer from the second surface to a second depth shallower than the first depth.

BRIEF DESCRIPTION OF THE DRAWINGS

The present disclosure will be better understood from the following detailed description with reference to the drawings, which are not necessarily drawn to scale and in which:

FIG. 5 is a cross-section diagram illustrating a preliminary semiconductor structure for disclosed method embodiments;

FIGS. 6.1-6.3 are cross-section diagrams illustrating alternative partially completed semiconductor structures formed according to the disclosed method embodiments;

FIGS. 7.1-7.4 are cross-section diagrams illustrating alternative partially completed semiconductor structures formed according to the disclosed method embodiments.

DETAILED DESCRIPTION

As mentioned above, factors considered in modern IC design include, but are not limited to, performance improvement, size scaling, and power consumption. Oftentimes, however, there is a tradeoff between these factors. For example, LDMOSFETs are widely used in amplifiers, such as RF amplifiers, microwave power amplifiers, etc. because of their low on-resistance and because, in general, they have a relatively high blocking voltage (also referred to in the art as the drain-to-source breakdown voltage (BVdss)). However, with device size scaling and operation at higher voltages, LDMOSFETs can exhibit performance degradation including, but not limited to, reduced BVdss and reduced transconductance (Gm).

In view of the foregoing, disclosed herein are embodiments of a semiconductor structure. This semiconductor structure can include a semiconductor layer and a device at least partially formed within the semiconductor layer. The device can include a well region within the semiconductor layer and at least one porous region within and shallower in depth than the well region. In some embodiments, the device can be a field effect transistor (FET) (e.g., a laterally diffused metal oxide semiconductor field effect transistor (LDMOSFETs)) including an active device region in the semiconductor layer. The well region can be toward one end of the active device region. The device can further include source and drain regions at opposite ends of the active device region with the drain region being immediately adjacent to the well region. The device can further include a gate on the active device region between the source and drain regions such that the porous region(s) is/are positioned laterally between the gate and the drain region. Thus, a drain drift region can extend through the well region around the porous region(s) to the drain region and the porous region(s) can modify the electric field in this drain drift region, thereby improving device performance (e.g., improving BVdss and Gm of an LDMOSFET). Embodiments can vary with regard to the number, size, shape, configuration, etc. of the porous region (s) within the well region. Also disclosed herein are method embodiments for forming the semiconductor structure.

Figure 1A:
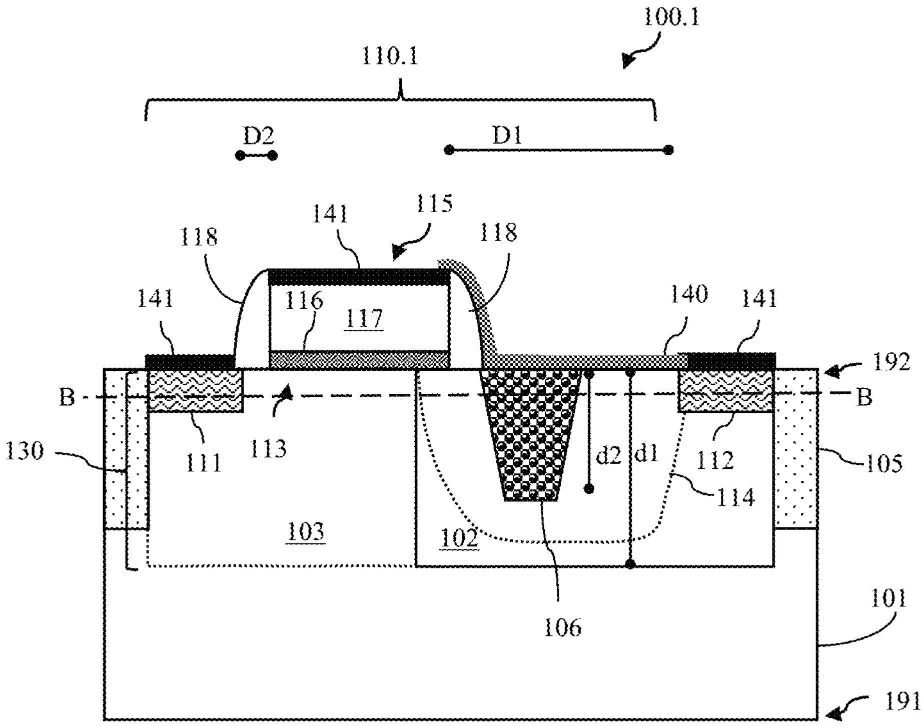
FIGS. 1A-1B are different cross-section diagrams illustrating a disclosed embodiment of a semiconductor structure.
Figure 1B:
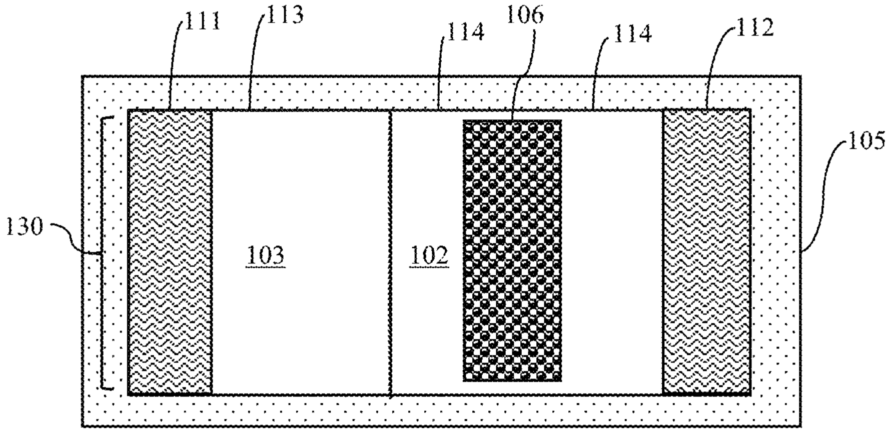
Figure 2A:
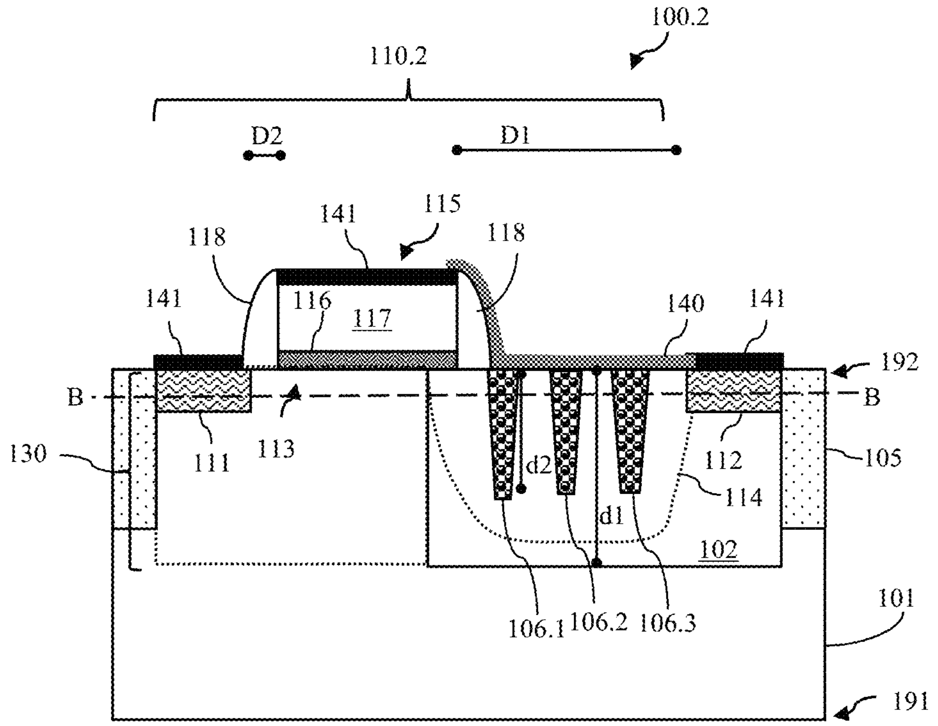
FIGS. 2A-2B are different cross-section diagrams illustrating another disclosed embodiment of a semiconductor structure.
Figure 2B:
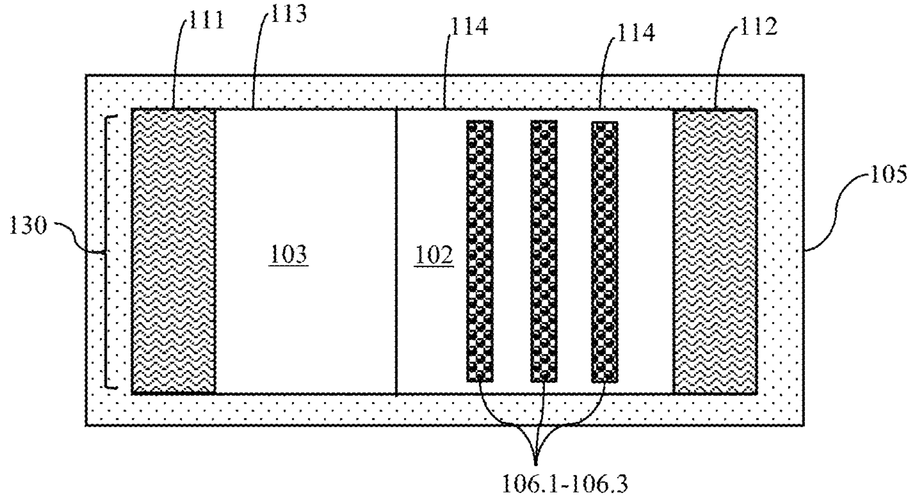
Figure 3A:
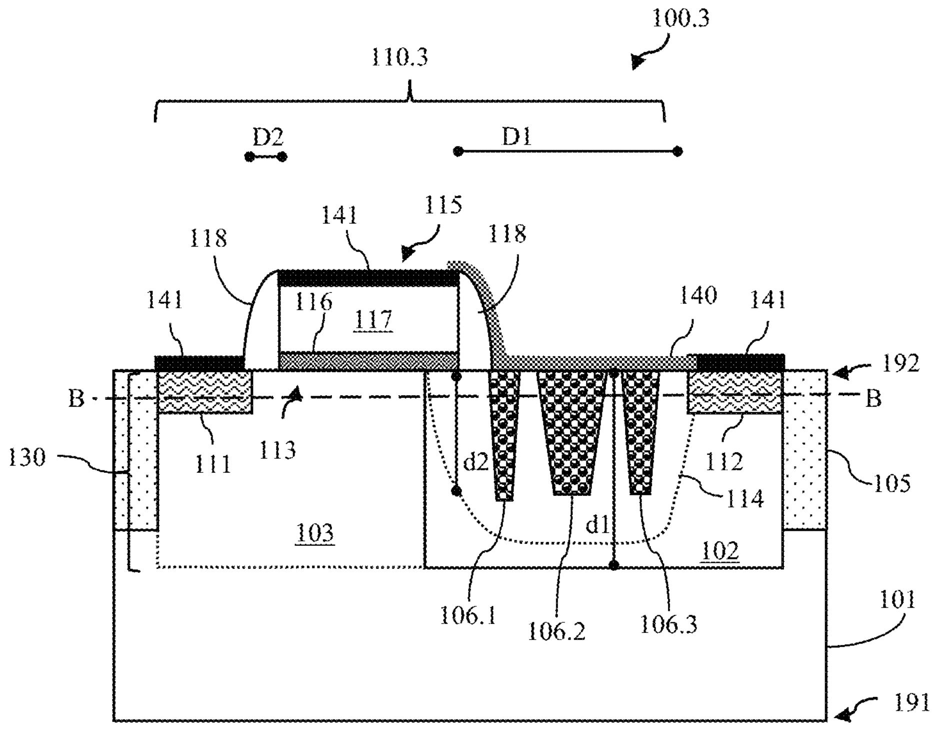
FIGS. 3A-3B are different cross-section diagrams illustrating yet another disclosed embodiment of a semiconductor structure.
Figure 3B:
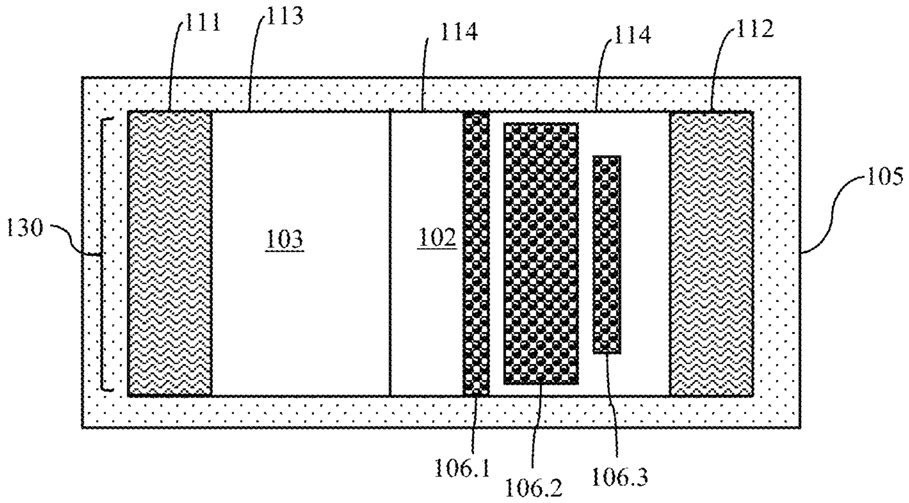
Figure 4A:
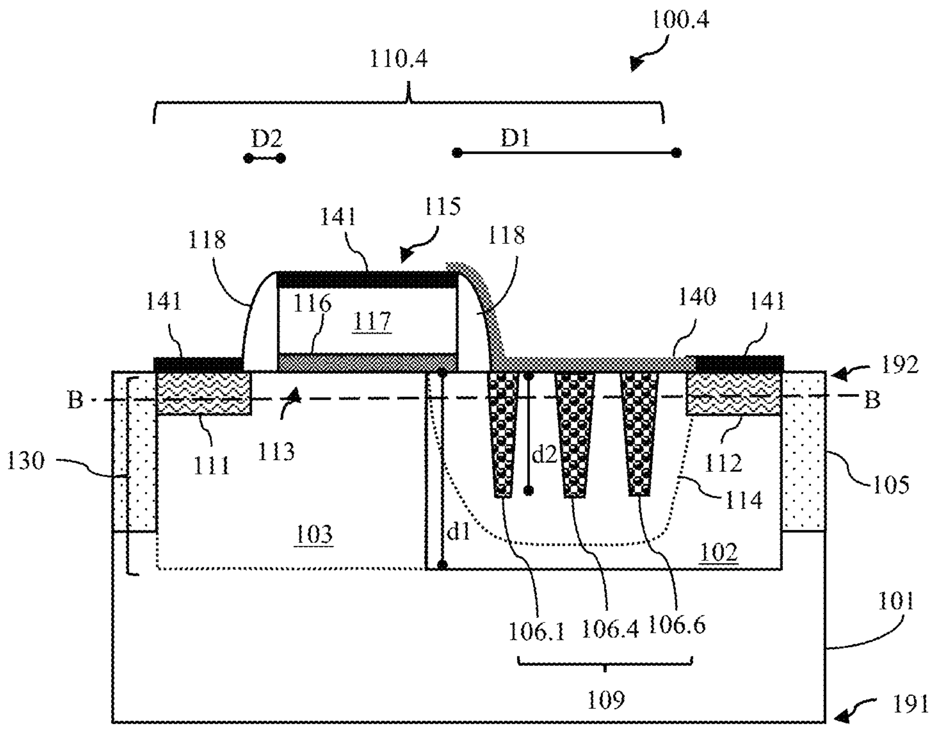
FIGS. 4A-4B are different cross-section diagrams illustrating yet another disclosed embodiment of a semiconductor structure.
Figure 4B:
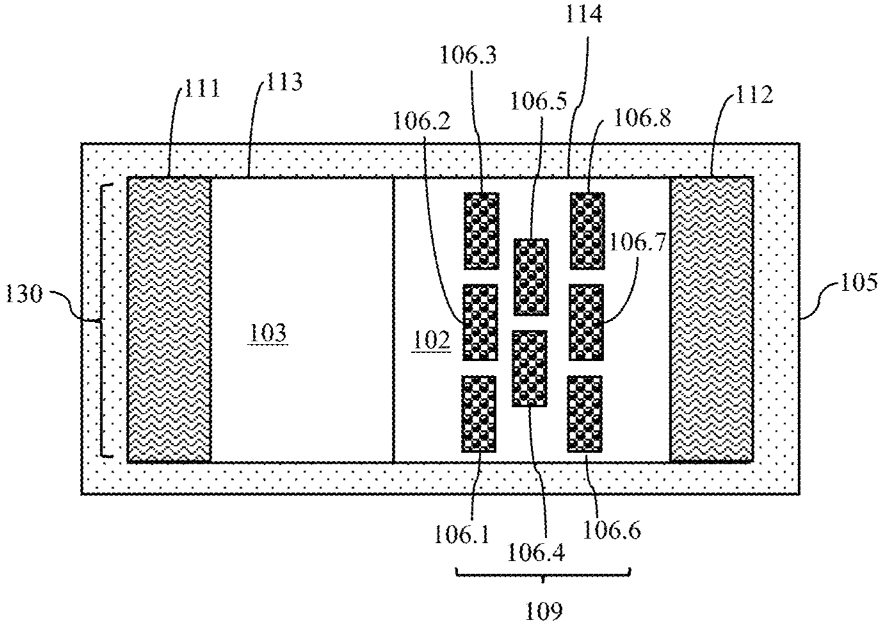

FIGS. 1A-1B are cross-section diagrams illustrating a disclosed embodiment of a semiconductor structure 100.1. FIGS. 2A-2B are cross-section diagrams illustrating another disclosed embodiment of a semiconductor structure 100.2. FIGS. 3A-3B are cross-section diagrams illustrating yet another disclosed embodiment of a semiconductor structure 100.3. FIGS. 4A-4B are different cross-section diagrams illustrating yet another disclosed embodiment of a semiconductor structure 100.4.

Referring to FIGS. 1A-1B, 2A-2B, 3A-3B, and 4A-4B, disclosed herein are embodiments of a semiconductor structure 100.1-100.4.

The semiconductor structure 100.1-100.4 can include a semiconductor layer 101 having a first surface 191 (i.e., a bottom surface) and a second surface 192 (i.e., a top surface) opposite the first surface 191. In some embodiments, the semiconductor layer 101 could be a bulk semiconductor substrate (e.g., a bulk silicon (Si) substrate or a bulk substrate of any other suitable semiconductor material, such as germanium (Ge), silicon germanium (SiGe), etc.), as illustrated. However, the figures are not intended to be limiting. Alternatively, the semiconductor layer 101 could be the semiconductor layer (e.g., a Si layer, a Ge layer, a SiGe layer, or a layer any other suitable semiconductor material) of a semiconductor-on-insulator structure (e.g., a silicon-on-insulator (SOI) structure, a germanium-on-insulator structure, a silicon germanium-on-insulator structure, etc.) such that the first surface 191 is above and immediately adjacent to an insulator layer (not shown) and the insulator layer on a substrate (e.g., a semiconductor substrate or some other suitable type of substrate). Alternatively, semiconductor layer 101 could be in a bulk region or a semiconductor-on-insulator region (e.g., an SOI region, etc.) of a hybrid substrate. Those skilled in the art will recognize hybrid substrates are typically employed at an advanced technology node, such as a fully-depleted SOI technology node, and include bulk and semiconductor-on-insulator regions. In any case, the semiconductor layer 101 can be, for example, doped with a P-type dopant so as to have P-type conductivity at a relatively low conductivity level (e.g., so as to be a P-semiconductor layer). See the detailed discussion below regarding semiconductor material doping to achieve different conductivity types and levels.

The semiconductor structure 100.1-100.4 can further include a semiconductor device 110.1-110.4. The semiconductor device 110.1-110.4 can include an active device region 130 in the semiconductor layer 101. Optionally, boundaries of the active device region 130 can be defined by a shallow trench isolation (STI) structure 105 external to the device. STI structure 105 can include a trench, which extends into the semiconductor layer 101 from the second surface 192 and which laterally surrounds and thereby defines the boundaries of the active device region. STI structure 105 can further include one or more layers of isolation material (e.g., silicon dioxide ($SiO_2$), silicon oxynitride (SiON), or some other suitable isolation material) that fills the trench. The active device region 130 can have opposing ends and opposing sides.

In some embodiments, the semiconductor device 110.1-110.4 can be an N-channel MOSFET, such as an N-channel LDMOSFET. In other embodiments, the semiconductor device 110.1-110.4 can be a P-channel MOSFET, such as a P-channel LDMOSFET.

In any case, the semiconductor device 110.1-110.4 can include one or more well regions (e.g., a well region 102 and an optional additional well region 103) extending into an upper portion of the semiconductor layer 101 to a first depth (d1), as measured from the second surface 192. Well region 102 can extend laterally from one end of the active device region 130 toward the center thereof and can further extend across the full width of the active device region 130 between the opposing sides. Optional additional well region 103 can extend from the opposite end of the active device region 130 toward the center thereof and can similarly extend across the width of the active device region 130 between the opposing sides. If present, optional additional well region 103 can be positioned laterally immediately adjacent to the well region 102, creating a junction between the two wells, or additional well region 103 can be separated from the well region 102 by some predetermined relatively short distance. Each well region (including the well region 102 and, if present, the optional additional well region 103) can be a dopant implant region. The well region 102 can be implanted with a first dopant so as to have a first type conductivity, whereas the optional additional well region 103, if present, can be implanted with a second dopant so as to have a second type conductivity that is different from the first type conductivity.

The conductivity types of well region 102 and optional additional well region 103 will vary depending upon whether the semiconductor device 110.1-110.4 is an N-channel MOSFET or a P-channel MOSFET. For example, in the case of an N-channel MOSFET, the well region 102 can be doped with an N-type dopant so as to have N-type conductivity (e.g., so the well region 102 is an Nwell) and, if present, the optional additional well region 103 can be doped with a P-type dopant so as to have P-type conductivity (e.g., so the additional well region 103 is a Pwell) at a higher conductivity level than the P-semiconductor layer. Optionally, a buried Nwell (not shown) can be aligned below the active device region 130 to isolate the semiconductor device 110.1-110.4 from the lower portion of the P-semiconductor layer below. In the case of a P-channel MOSFET, the well region 102 can be doped with a P-type dopant so as to have P-type conductivity (e.g., so the well region 102 is a Pwell) and, if present, the optional additional well region 103 can be doped with an N-type dopant so as to have N-type conductivity (e.g., so the additional well region 103 is an Nwell). In such a P-channel MOSFET, the well region 102 and, if present, the optional additional well region 103 can be contained within a deep Nwell (not shown), which extends into the upper portion of the P-semiconductor layer 101 from the second surface 192 to a depth that is deeper than that of the well region 102 and optional additional well region 103 to isolate the semiconductor device 110.1-110.4 from the lower portion of the semiconductor layer 101 below. See the detailed discussion below regarding semiconductor material doping to achieve different conductivity types and levels.

The semiconductor device 110.1-110.4 can further include a drain region 112 and a source region 111 at opposite ends of the active device region 130 (e.g., abutting STI structure 105). The drain region 112 and the source region 111 can have the same type conductivity as the well region 102, but at a higher conductivity level. Thus, for example, in the case of an N-channel MOSFET, the drain region 112 and the source region 111 can be N+ drain and source regions; whereas, in the case of a P-channel MOSFET, the drain region 112 and the source region 111 can be P+ source and drain regions. The drain region 112 can be in and/or on the upper portion of the semiconductor layer 101 at one end of the active device region 130 and can be immediately adjacent to the well region 102. The source region 111 can be in and/or on the semiconductor layer 101 at the opposite end of the active device region 130 and can be immediately adjacent to the optional additional well region 103 (if present and as illustrated), immediately adjacent to the P-semiconductor material in the case of an N-channel MOSFET (not shown), or immediately adjacent to the deep Nwell, as discussed above, in the case of a P-channel MOSFET (not shown). Various different source/drain configurations for semiconductor devices, such as MOSFETs and particularly LDMOSFETs, are well known in the art. Thus, the details thereof have been omitted from this specification to allow the reader to focus on the salient aspects of the disclosed embodiments. However, the source/drain regions 111-112 could have any suitable source/drain region configuration. For example, the source/drain regions 111-112 could be shallow dopant implant regions in the upper portion of the semiconductor layer 101 at the second surface 192. Alternatively, the source/drain regions 111-112 could include source/drain trenches in the upper portion of the semiconductor layer 101 and in situ doped epitaxial semiconductor layers that fill or over-filled source/drain trenches in the semiconductor layer. In any case, such source/drain regions 111-112 can be shallower in depth than the well region 102 (and, if present, optional additional well region 103).

The semiconductor device 110.1-110.4 can further include at least one porous region within the well region 102, extending into the upper portion of the semiconductor layer 101 to a second depth (d2), which is shallower than the first depth (d1) of the well region 102, as measured from the second surface 192 (e.g., see porous region 106 in semiconductor device 110.1 of the semiconductor structure 100.1 of FIGS. 1A-1B, porous regions 106.1-106.3 in the semiconductor devices 110.2 and 110.3 of the semiconductor structures 100.2 and 100.3 of FIGS. 2A-2B and 3A-3B, respectively, and porous regions 106.1-106.8 in the semiconductor device 110.4 of the semiconductor structure 100.4 of FIGS. 4A-4B). As illustrated, at least the bottom and opposing sides of each porous region are surrounded by crystalline regions of the same semiconductor material. If the semiconductor layer 101 is a Si layer, the porous region(s) can be porous Si (PS) region(s) with crystalline Si (CS) adjacent to at least the bottom and opposing sides. If the semiconductor layer 101 is a SiGe layer, the porous region(s) can be porous SiGe region(s) with crystalline SiGe adjacent to at least the bottom and opposing sides, and so on. For purposes of this disclosure, a porous region or a region of porous semiconductor material refers specifically to a region of semiconductor material that includes nanopores within its microstructure. Nanopores refer to nanoscale pores (e.g., holes, pockets, etc.) with a diameter of 1-100 or more nanometers distributed throughout the region of semiconductor material at issue. Those skilled in the art will recognize that porous region of a semiconductor layer will be more resistive than a non-porous region having the same doping. As discussed in greater detail below with regard to the method embodiments such nanopores can be introduced into a localized region of a semiconductor material through an electrochemical process.

Embodiments can vary with regard to the number, size, shape, configuration, etc. of the porous region(s) within the well region.

For example, referring to the semiconductor structure 100.1 of FIG. 1, in some embodiments, the semiconductor device 110.1 can include a single porous region 106. This porous region 106 can be essentially parallel to but physically separated from the drain region 112. As illustrated, this single porous region 106 can be essentially rectangular in shape, as in the horizontal cross-section. Alternatively, the single porous region 106 could have any other suitable shape (e.g., square, oval, circle, etc.), as viewed in a horizontal cross-section. In any case, the porous region 106 can at least partially traverse the width of the active device region 130. For example, as illustrated, the porous region 106 may extend only partially across the full width of the active device region 130. Alternatively, porous region 106 could extend the full width of the active device region 130.

Alternatively, referring to the semiconductor structures 100.2 of FIGS. 2A-2B and 100.3 of FIGS. 3A-3B, in other embodiments, the semiconductor device 110.2, 110.3 can include multiple essentially parallel porous regions 106.1-106.3, which are physically separated from each other, essentially parallel to the drain region 112, and at least partially traversing the width of the active device region 130. For illustration purposes, three porous regions 106.1-106.3 are shown in the figures. However, the figures are not intended to be limiting. Alternatively, such semiconductor devices could include any number of two or more porous regions. Additionally, as illustrated in FIGS. 2A-2B, these essentially parallel porous regions 106.1-106.3 can all be essentially identical in size (e.g., length, width, and depth dimensions) and shape (e.g., rectangle (as illustrated), oval, etc.), as viewed in a horizontal cross-section. Furthermore, the porous regions 106.1-106.3 may or may not extend across the full width of the active device region 130. Alternatively, as illustrated in FIGS. 3A-3B, two or more of the porous regions 106.1-106.3 could have different sizes (e.g., different lengths, widths and/or depth dimensions) and/or different shapes.

Alternatively, referring to the semiconductor structure 100.4 of FIGS. 4A-4B and, in still other embodiments, the semiconductor device 110.4 can include some other pattern 109 of multiple porous regions 106.1-106.8. For purposes of illustration, the pattern 109 is shown as having eight porous regions that are essentially identical in size (e.g., in length, width, and depth dimensions) and shape, as viewed in a horizontal cross-section (e.g., rectangle (as illustrated), oval, square, circle, etc.). However, the pattern 109 could include any number of two or more porous regions. Furthermore, two or more of the porous regions could have different sizes and/or different shapes. Additionally, pattern 109 could be a structured pattern. For example, as illustrated, the porous regions in pattern 109 could be arranged in parallel rows, where each row contains multiple aligned porous regions and where adjacent porous regions in adjacent rows are offset. Alternatively, the porous regions in the pattern 109 could be arranged in rows and columns, where a porous region in any given column and row is aligned in a first direction with all the porous regions in the same row and in a second direction with all porous regions in the same row (not shown). Alternatively, the porous regions in pattern 109 could be randomly arranged (not shown).

The semiconductor device 110.1-110.4 can further include a gate 115 on the second surface 192 of the semiconductor layer 101 between the source region 111 and the drain region 112 and, more particularly, between source region 111 and the porous region(s). Gate 115 can be located on the second surface 192 and can extend laterally from the source region 111 over the portion of the semiconductor layer 101 between the source region 111 and the well region and further onto the well region 102. The gate 115 can include a gate stack including a gate dielectric layer 116 (including one or more layers of gate dielectric material) and a gate conductor layer 117 (including one or more layers of gate conductor material) on the gate dielectric layer 116. Such a gate 115 could be a gate first polysilicon gate, a gate first high-K metal gate, a replacement metal gate, etc.

Various different gate configurations for semiconductor devices, such as MOSFETs, are well known in the art. Thus, the details thereof have been omitted from this specification to allow the reader to focus on the salient aspects of the disclosed embodiments. However, those skilled in the art will recognize that a gate first polysilicon gate will typically include a gate oxide layer (e.g., a silicon dioxide layer, a silicon oxynitride layer, or some other suitable gate dielectric layer) and a doped polysilicon gate conductor layer on the gate oxide layer. A high-K metal gate will typically include a high-K gate dielectric layer and one or more gate conductor layers (including at least one work function metal or metal alloy layer) on the gate dielectric layer. Those skilled in the art will recognize that a high-K gate dielectric layer refers to a gate dielectric layer made of a dielectric material with a dielectric constant that is greater than the dielectric constant of silicon dioxide (i.e., greater than 3.9). High-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-K dielectrics (e.g., aluminum oxide, tantalum oxide, zirconium oxide, etc.). The work function metal or metal alloy layer can have a work function that is suitable for both NFET and PFET operations. Alternatively, the work function metal or metal alloy layer can have a work function that is suitable for either N-channel MOSFET performance or P-channel MOSFET performance. The gate conductor work function suitable for an N-channel MOSFET is, for example, between 3.9 eV and about 4.2 eV. Metals (and metal alloys) having a work function within this range include, but are not limited to, hafnium, lanthanum, zirconium, titanium, tantalum, aluminum, and alloys thereof, such as, hafnium carbide, zirconium carbide, titanium carbide, tantalum carbide, and aluminum carbide. The gate conductor work function suitable for a P-channel MOSFET is, for example, between about 4.9 eV and about 5.2 eV. Metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). A metal gate structure will also typically include one or more additional gate conductor layers on the work function metal or metal alloy layer. The additional gate conductor layers can be, for example, a doped polysilicon layer and/or a fill metal or metal alloy layer (e.g., tungsten, cobalt, aluminum, or any other suitable fill metal or metal alloy layer).

In any case, gate 115 can have opposing sidewalls separated from the drain region 112 and the source region 111 by different distances. For example, a first sidewall of gate 115 can be separated from the drain region 112 by a first distance (D1) and a second sidewall of the gate 115 can be separated from the source region 111 by a second distance (D2) that is less than the D1.

Gate sidewall spacers 118 can be positioned laterally adjacent to the opposing sidewalls of gate 115. Gate sidewall spacers 118 can be made of one or more layers of dielectric spacer material, such as SiO2 and/or any other suitable dielectric spacer material. Various different gate sidewall spacer configurations are known in the art. Thus, the details thereof have been omitted from this specification to allow the reader to focus on the salient aspects of the disclosed embodiments.

The semiconductor device 110.1-110.4 can further include a patterned dielectric layer 140 covering an area of the second surface 192 of the semiconductor layer 101 on the drain side of gate 115. Specifically, the patterned dielectric layer 140 can have an end adjacent to the drain region 112, an opposite end adjacent to the gate sidewall spacer 118 on the drain side of the gate 115, and sides extending onto the STI structure 105. Dielectric layer 140 can completely cover the second surface 192 of the semiconductor layer 101 between the drain region 112 and the gate 115. Dielectric layer 140 can be a thin, patterned, conformal block layer (e.g., a silicide block (SAB) layer) of any suitable dielectric material, which can be selectively etched over other dielectric materials (e.g., of the gate sidewall spacers, of the STI structure, of a gate cap, etc.) and vice versa (as discussed below with regard to the method embodiments) and which can block metal-semiconductor alloy formation (e.g., metal silicide formation) on semiconductor surfaces below during processing. Thus, for example, the dielectric layer 140 can include a different dielectric material than the dielectric materials used for the gate sidewall spacers 118, STI structure 105, and the gate cap (which is formed during processing and subsequently removed). For example, if the gate sidewall spacers 118 and STI structure 105 are $SiO_2$ structures and if the gate cap is a silicon nitride (SiN) gate cap, then the dielectric layer 140 can be a silicon oxynitride (SiON) layer, an oxide-nitride-oxide (ONO) layer, etc.

Additionally, although not shown (e.g., in order to avoid clutter in the drawings), additional features of the semiconductor structure 100.1-100.4 can include, but are not limited to: metal silicide layers 141 (e.g., cobalt silicide layers, nickel silicide layers, tungsten silicide layers, or layers of any other suitable metal silicide material) on the source/drain regions 111-112 and, optionally, on a polysilicon gate conductor layer; one or more layers of interlayer dielectric (ILD) material (e.g., a relatively thin conformal etch stop layer, such as a relatively thin SiN layer, and, on the etch stop layer, a blanket layer of $SiO_2$ doped silicon glass, such as phosphosilicate glass (PSG) or borophosphosilicate glass (BPSG), or any other suitable ILD material) over the semiconductor device 110.1-110.4; middle of the line (MOL) contacts extending through the ILD material at least to the source region 111, drain region 112, and gate 115 of the semiconductor device 110.1-110.4; and back end of the line (BEOL) metal levels that electrically connect the semiconductor device 110.1-110.4 to other on-chip or off-chip components. MOL and BEOL features are well known in the art and, thus, the details thereof have been omitted from this specification to allow the reader to focus on the salient aspects of the disclosed embodiments.

Configured, as described above, the semiconductor device 110.1-110.4 also includes a channel region 113 within the semiconductor layer 101 at the second surface 192. The channel region 113 can be aligned below that portion of gate 115, which extends laterally between the source region 111 and the well region 102. Depending upon the bias conditions on the device terminals (e.g., gate, source, drain, etc.), the semiconductor device 110.1-110.2 can be in an ON state during which the channel region 113 is conductive allowing current to flow therethrough or in an OFF state during which the channel region 113 is non-conductive preventing current from flowing therethrough. Those skilled in the art will recognize that these bias conditions will vary depending upon whether the semiconductor device 110.1-110.4 is an N-channel MOSFET or a P-channel MOSFET.

Configured as described above, the semiconductor device 110.1-110.4 also includes a drain drift region 114 and, particularly, a current path that extends into the well region 102 from the channel region 113 and that further extends through the well region 102 around the porous region(s) (e.g., 106 in the semiconductor device 110.1 of the semiconductor structure 100.1 of FIGS. 1A-1B, 106.1-106.3 in the semiconductor device 110.2 or 110.3, or 106.1-106.8 in the semiconductor device 110.4) to the drain region 112. The presence of these porous region(s) within the conductive path of the drain drift region 114 effectively modifies the electric field and, as a result, improves BVdss and Gm of the device.

Also disclosed herein are method embodiments for forming the various semiconductor structure embodiments described above and illustrated in FIGS. 1A-1B, 2A-2B, 3A-3B, and 4A-4B.

The method can include providing a semiconductor layer 101 having a first surface 191 (i.e., a bottom surface) and a second surface 192 (i.e., a top surface) opposite the first surface 191 (see FIG. 5). As discussed above with regard to the structure embodiments, the semiconductor layer 101 could be a bulk semiconductor substrate (e.g., a bulk Si substrate or a bulk substrate of any other suitable semiconductor material, such as Ge, SiGe, etc.), as illustrated. Alternatively, semiconductor layer 101 could be the semiconductor layer of a semiconductor-on-insulator structure. Alternatively, semiconductor layer 101 could be in either a bulk region or a semiconductor-on-insulator region of a hybrid substrate. In any case, the semiconductor layer 101 can be doped with a P-type dopant so as to have P-type conductivity at a relatively low conductivity level (e.g., so as to be a P-semiconductor layer).

Optionally, the method can begin with forming a well region 102 and/or an optional additional well region 103 (e.g., dopant implant regions) within the semiconductor layer 101 (see FIGS. 6.1-6.3). For example, the partially completed semiconductor structure shown in FIG. 6.1 with two adjacent wells 102 and 103 can be formed using discrete masked dopant implantation processes. That is, a mask layer (e.g., a hardmask layer, such as a SiN hardmask layer) could be formed on the second surface 192 of semiconductor layer 101. Conventional lithographic patterning and anisotropic etch processes can be performed to form an opening in the mask layer, which exposes a first area of the semiconductor layer 101. A first dopant can be implanted through the opening to form a well region 102 having a first type conductivity at a desired conductivity level. The mask layer can then be selectively removed. Similarly, an additional mask layer (e.g., another hardmask layer, such as a SiN hardmask layer) could be formed on the second surface 192 of semiconductor layer 101. Conventional lithographic patterning and anisotropic etch processes could be performed to form an opening in the additional mask layer, which exposes a second area of the semiconductor layer positioned laterally adjacent to the first area (e.g., abutting the first area or separated from the first area by a relatively small distance). A second dopant can be implanted through the opening in the additional mask layer to form the additional well region 103 having the second type conductivity (which is different from the first type conductivity of the well region 102) at a desired conductivity level. The second mask can then be selectively removed. Such masked dopant implantation processes are well known in the art. Thus, the details thereof have been omitted from this specification to allow the reader to focus on the salient aspects of the disclosed embodiments.

As discussed above with regard to the semiconductor structure embodiments, the first type conductivity of the well region 102 and the second type conductivity of the optional additional well region 103 will vary depending upon whether the semiconductor device 110.1-110.4 is an N-channel MOSFET or a P-channel MOSFET. Specifically, in the case of an N-channel MOSFET, the implantation processes should be performed so that the well region 102 has N-type conductivity (e.g., so the well region 102 is an Nwell) and so that, if being formed, the optional additional well region 103 has P-type conductivity (e.g., so the optional additional well region 103 is a Pwell). For an N-channel MOSFET, a buried Nwell (not shown) can also be formed between and separated from both the first surface 191 and the second surface 192 of the semiconductor layer 101 using another dopant implantation process. Such a buried Nwell can electrically isolate the N-channel MOSFET from the lower portion of the P-semiconductor layer 101 below. In the case of a P-channel MOSFET, a deep Nwell (not shown) can be formed so as to encompass the active device region 130. Then, additional implantation processes should be performed so that, within the deep Nwell, the well region 102 has P-type conductivity (e.g., so the well region 102 is a Pwell) and so that, if being formed, the optional additional well region 103 has N-type conductivity (e.g., so the optional additional well region 103 is an Nwell). For purposes of illustration, subsequent processing steps are described below with respect to the partially completed semiconductor structure 6.1 that includes well region 102 and optional additional well region 103. However, essentially the same process steps (unless otherwise noted) could be performed with respect to any of the partially completed structures shown in FIG. 5 or FIGS. 6.1-6.3. In any case, the implantation process can be performed such that the well region 102 extends into the upper portion of the semiconductor layer 101 to a first depth (d1), as measured from the second surface 192.

The method can further include forming at least one porous region (i.e., a region of porous semiconductor material) within the semiconductor layer 101 and, particularly, within the well region 102 (if previously formed) or within an area designated for well region 102 formation. For example, referring to FIGS. 7.1-7.4, a mask layer 701 (e.g., a hardmask layer, such as a SiN hardmask layer) could be formed on the second surface 192 of the semiconductor layer 101. Conventional lithographic patterning and anisotropic etch processes can be employed to form a pattern of one or more openings within the mask layer 701 to expose corresponding areas of the second surface 192 of the semiconductor layer 101 below. Embodiments can vary with regard to the pattern of opening(s) formed in the mask layer 701.

For example, as illustrated in FIG. 7.1, in some embodiments, a single opening 702 can be formed in the mask layer 701. The shape of the single opening 702, as viewed in a horizontal cross-section, could be a rectangle (as illustrated) or any other suitable shape (e.g., oval, circle, square, etc.).

As illustrated in FIGS. 7.2 and 7.3, in other embodiments, multiple essentially parallel openings 702.1-702.3, which are physically separated from each other, can be formed in the mask layer 701. For illustration purposes, three essentially parallel openings are shown in the figures. However, the figures are not intended to be limiting. Alternatively, any number of (e.g., two or more) parallel openings could be formed. The shape of each opening, as viewed in a horizontal cross-section, can be a rectangle (as illustrated), an oval, etc. Additionally, as illustrated in FIG. 7.2, these essentially parallel openings 702.1-702.3 can be essentially identical in size and shape. Alternatively, as illustrated in FIG. 7.3, two or more of the essentially parallel openings 702.1-702.3 could have different sizes and/or different shapes, as viewed in a horizontal cross-section.

As illustrated in FIG. 7.4, in other embodiments, some other pattern 709 of multiple openings 702.1-702.8, which are physically separated from each other, can be formed in mask layer 701. For the purposes of illustration, pattern 709 is shown as having eight openings that are essentially identical in size and shape. However, the pattern 709 could include any number of two or more openings. Furthermore, two or more of the porous regions could have different sizes and/or different shapes. Additionally, the pattern 709 could be a structured pattern or a random pattern.

Porous region(s) 106 can be formed in the semiconductor layer 101 below the opening(s) 702 in the mask layer 701. Due to placement of the opening(s) 702, the porous region(s) 106 will be formed in the well region 102, if previously formed, or in an area designated for subsequent formation of well region 102. This processing can be, for example, electrochemical etch processing. For purposes of illustration, this electrochemical etch process is shown with respect to a partially completed semiconductor structure that includes the mask layer 701 with a single opening 702 shown in FIG. 7.1. This same electrochemical etch process could be performed with respect to any of the above-described partially completed semiconductor structures that include a mask with one or more openings (e.g., as shown in FIGS. 7.1-7.4).

Figure 8:
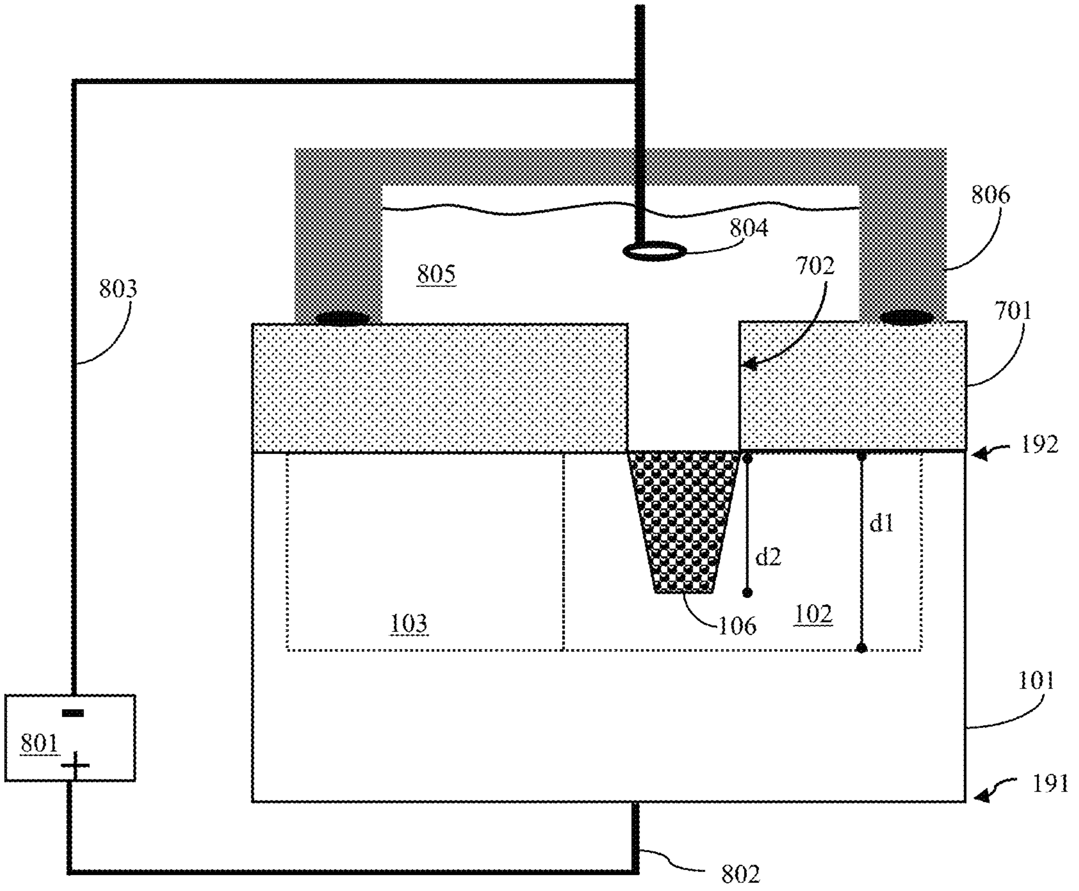
FIGS. 8-15 are cross-section diagrams illustrating partially completed semiconductor structures formed according to disclosed method embodiments.

The electrochemical processing converts the semiconductor material in the region(s) of the semiconductor layer below the opening(s) 702 in the mask layer 701 to a porous semiconductor material by causing the formation of nanopores to be introduced therein. As illustrated in FIG. 8, an electrochemical etch technique for forming the porous region(s) (e.g., porous Si region(s) in the Si layer) can employ a power source 801 (e.g., a DC voltage supply) with a negative electrode 803 and a positive electrode 802. A vessel 806 or other containment structure can be configured to hold an etchant 805 (e.g., an etching solution, such as an aqueous hydrofluoric acid (HF) electrolyte solution) such that the surface of the semiconductor layer 101 at the bottom of each opening 702 is exposed thereto. The negative electrode 803 of the power source 801 can be electrically connected to a metallic cathode 804 (e.g., a platinum cathode or other suitable cathode material) in etchant 805. The positive electrode of the power source 801 can be electrically connected to the backside of the semiconductor layer 101 (i.e., the anode). When the power source 801 is turned on, electrochemical reactions occur at both the cathode and the anode. Specifically, semiconductor (e.g., Si) material at the second surface 192 of the semiconductor layer 101 (anode) reacts with water to form an oxide layer (e.g., $SiO_2$). The oxide layer dissolves in the aqueous HF as hexafluorosilicate ($SiF_6$), thereby allowing oxidation to continue resulting in the creation of the nanopores therein. Alternatively, any other suitable technique for localized formation of porous region(s) can be performed. In any case, porous region process can be performed so that the porous region(s) extend into the upper portion of the semiconductor layer 101 to a second depth (d2) that is shallower than the first depth (d1) of the well region 102, as measured from the second surface 192.

Alternatively, any other suitable technique could be employed to form the porous region(s).

Figure 9:
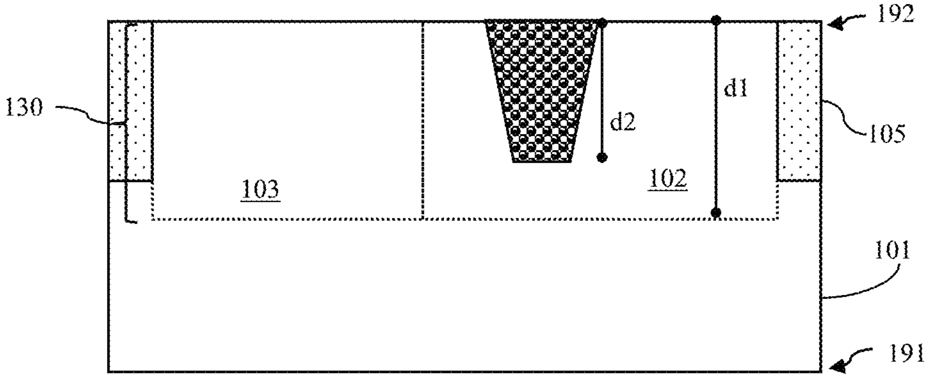

The method can further include forming an STI structure 105 in the semiconductor layer 101 laterally surrounding a designated active device region 130 for the semiconductor device (see FIG. 9). The STI structure 105 can be formed, for example, using conventional STI formation techniques. That is, a trench can be formed in the upper portion of the semiconductor layer 101 to laterally surround the designated active device region (e.g., using conventional lithographic patterning and anisotropic etch techniques). This designated active device region 130 will include the previously formed porous region(s) and any previously formed well regions (e.g., 102, 103, etc.) for the semiconductor device. Following trench formation, one or more layers of isolation material (e.g., SiO2, SiN, etc.) can be deposited (e.g., by chemical vapor deposition (CVD)) so as to fill the trench. Then, a chemical mechanical polishing (CMP) process can be performed to remove any isolation material from the second surface 192.

Figure 10:
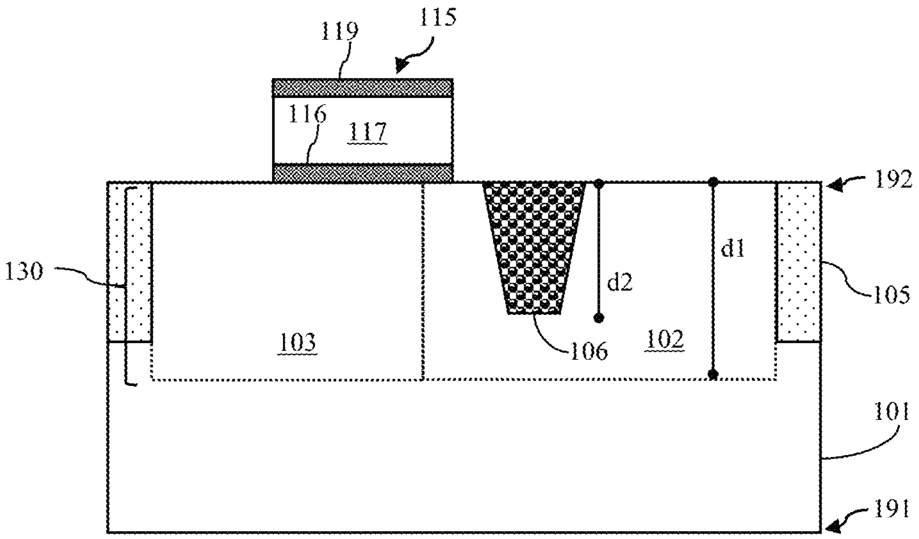

The method can further include forming gate 115 (including a gate dielectric layer 116 and a gate conductor layer 117 thereon) on the second surface 192 of the semiconductor layer 101 (see FIG. 10). Such a gate 115 can, for example, be formed using a gate first polysilicon gate formation technique or a gate first metal gate formation technique. Such techniques are well known in the art. Thus, the details thereof have been omitted from the specification to allow the reader to focus on the salient aspects of the disclosed embodiments. However, generally, gate first gate formation techniques can include formation (e.g., by atomic layer deposition (ALD) or some other thin film deposition technique) of a gate dielectric layer 116 (including one or more layers of gate dielectric material), formation of a gate conductor layer 117 (including one or more layers of gate conductor materials) on the gate dielectric layer 116, and formation (e.g., by ALD) of a dielectric gate cap layer (e.g., a SiN gate cap layer) on the gate conductor layer. Conventional lithographic patterning and etch processes can then be used to pattern the stack of layers into an essentially rectangular-shaped body that traverses the full width of the active device region 130 (i.e., a gate 115). For an LDMOSFET, gate 115 can be offset from the center of the active device region 130 such that it is closer to a designated source region at one end than it is to a designated drain region at the opposite end.

Figure 11:
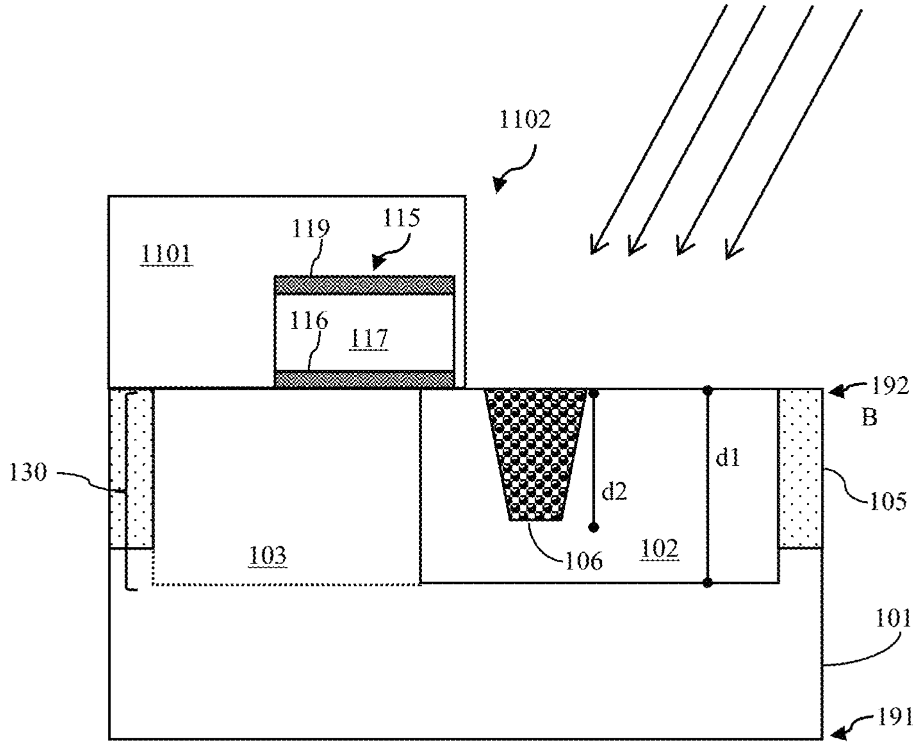

If well region 102 was not previously formed (e.g., as shown in FIG. 5 or FIG. 6.3 before gate formation porous region formation), then well region 102 can be formed following gate formation (see FIG. 11). For example, a mask layer 1101 can be formed over the partially completed structure. Conventional lithographic patterning and anisotropic etch processes can be performed to form an opening 1102 in the mask layer 1101, which exposes the portion of the semiconductor layer 101 on the side of gate 115 that includes the porous region(s). A dopant implantation process can then be performed to implant a first dopant into the exposed portion and the semiconductor layer 101, thereby forming the well region 102. As discussed in detail above, the well region 102 can be formed as an Nwell for an N-channel MOSFET or as a Pwell for a P-channel MOSFET. The mask layer 1101 can then be selectively removed. Whether well region 102 is formed before or after porous region formation, the porous region(s) should be shallower in depth (as measured from the second surface 192 of the semiconductor layer) than the well region 102. The mask layer 1101 can then be selectively removed.

Figure 12:
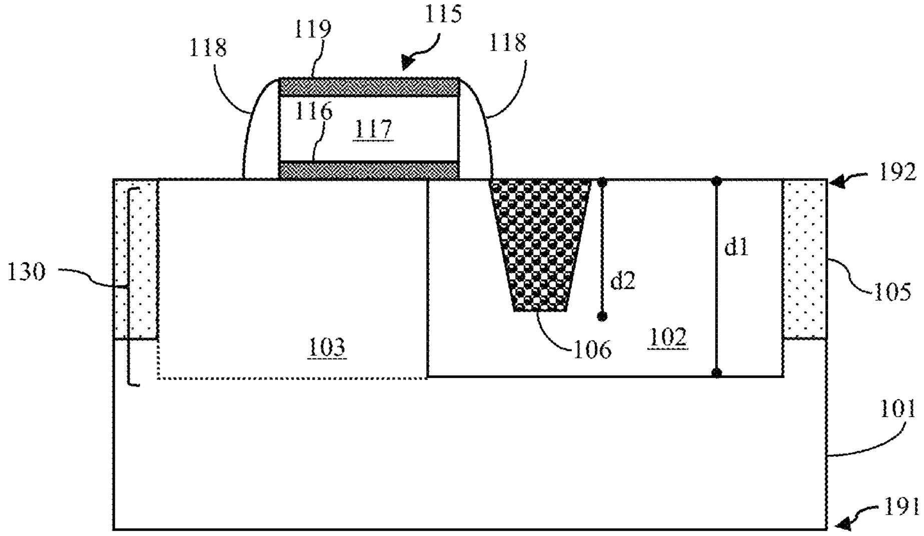

One or more layers of dielectric spacer material can be conformally deposited (e.g., by chemical vapor deposition (CVD) or some other suitable deposition technique) over the partially completed structures. The spacer material could include, for example, SiN, SiO2 and/or any other suitable dielectric spacer material(s). A selective anisotropic etch process can then be performed to remove the spacer material from horizontal surfaces, leaving it intact on vertical surfaces (i.e., the gate sidewalls) as gate sidewall spacers 118 (see FIG. 12).

Figure 13:
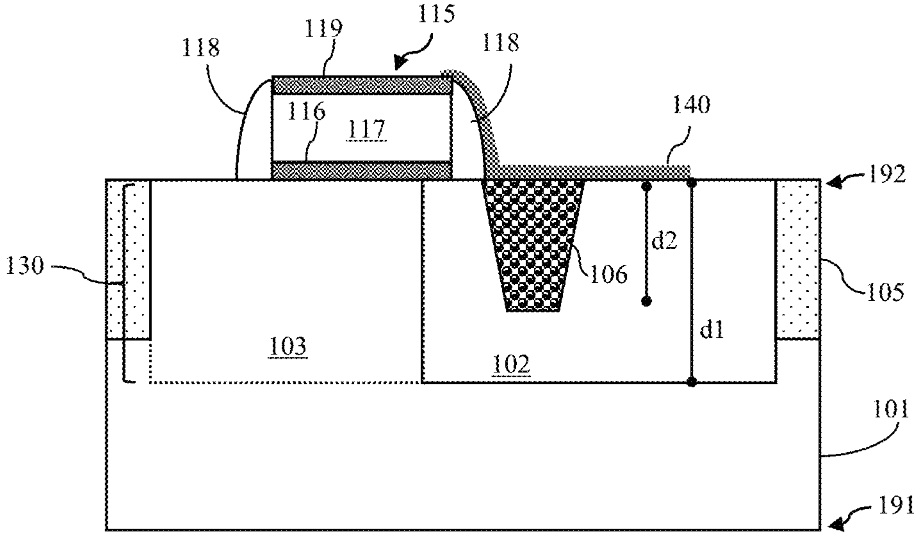

A relatively thin conformal dielectric layer 140 (e.g., a SAB layer of, for example, SiON, ONO, or any other suitable SAB material) can be deposited (e.g., by plasma-enhanced atomic layer deposition (PE-ALD) or some other suitable thin film technique) over the partially completed semiconductor structure. The dielectric layer 140 can be made of a different dielectric material than the dielectric materials used for the gate sidewall spacers 118, STI structure 105, and the gate cap 119 to facilitate subsequent patterning of the dielectric layer and selective removal of the gate cap 119. As illustrated, in FIG. 13, dielectric layer 140 can subsequently be patterned using conventional lithographic patterning and anisotropic etch techniques so that a portion of the dielectric layer 140 is remains above the porous region(s), has one end extending toward but physically separated from the STI structure 105, has an opposite end adjacent to the gate sidewall spacer 118 on the drain side of the gate 115, and sides extending onto the STI structure 105.

Figure 14:
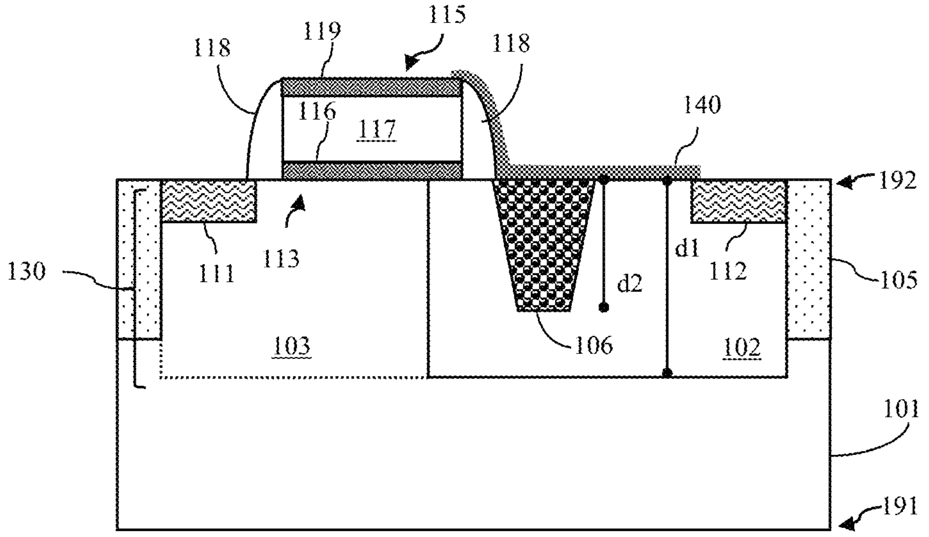

Source/drain regions 111-112 for the semiconductor device 110.1-110.4 can then be concurrently formed in and/or on exposed areas of the semiconductor layer 101 on either side of gate 115 (see FIG. 14). The source region 111 can extend between a gate sidewall spacer 118 and the STI structure 105 and the drain region 112 can extend between an end of the dielectric layer 140 and the STI structure 105. Thus, the porous region(s) 106 are within the well region 102 between the gate 115, the drain region 112 is separated from the gate 115 by a first distance (D1) and the source region 111 is separated from the gate 115 by a second distance (D2) that is less than the first distance (D1). Various different source/drain formation techniques for MOSFETs and, more particularly, for LDMOSFETs are well known in the art (e.g., by dopant implantation and/or in situ doped epitaxial deposition). Thus, descriptions of these techniques have been omitted from the specification to allow the reader to focus on the salient aspects of the disclosed embodiments. In any case, the drain region 112 and the source region 111 can be concurrently formed so that they have the same type conductivity as the well region 102, but at a higher conductivity level. As discussed in detail above, for an N-channel MOSFET the source/drain regions can be formed as N+ regions, whereas, for a P-channel MOSFET, the source/drain regions can be formed as P+ regions.

Figure 15:
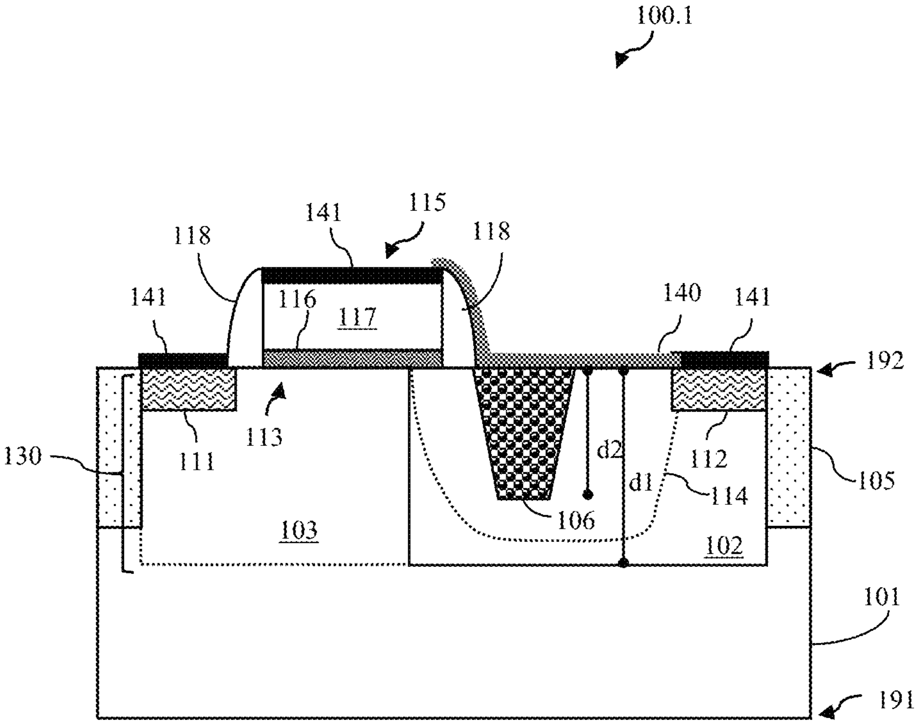

Following source/drain formation, metal silicide layers 141 can be formed on the source/drain regions 111-112 and, optionally, on a polysilicon gate conductor layer if included in the gate 115 (e.g., following selective removal of the gate cap 119) (see FIG. 15). Such metal silicide layers 141 can be formed, for example, using a conventional self-aligned process where a metal (e.g., cobalt, tungsten, nickel, etc.) is deposited over the partially completed semiconductor structure and subjected to an anneal process, thereby causing a reaction at the metal-silicon interface, thus forming a metal silicide. Any unreacted metal can then be selectively removed.

Although not shown (e.g., in order to avoid clutter in the drawings), additional processing can include, but is not limited to, the formation of well contact region(s), the formation of one or more layers of interlayer dielectric (ILD) material over the device, and the formation of MOL contacts extending through the ILD material to the source region 111, drain region 112, gate 115 and well contact region(s). As mentioned above, the process steps described above are illustrated in FIGS. 8-15 with respect to the partially completed semiconductor structure shown in FIG. 7.1 and result in formation of the semiconductor structure 100.1 of FIGS. 1A-1B. However, these same process steps could be performed with respect to the partially completed semiconductor structures shown in FIG. 7.2, 7.3 or 7.4, thereby resulting in formation of the semiconductor structures 100.2, 100.3 or 100.4 of FIGS. 2A-2B, FIGS. 3A-3B, and 4A-4B, respectively.

In the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, in the structure and method embodiments described above, the terminology used is for the purpose of describing the disclosed structures and methods and is not intended to be limiting. For example, as used herein, the singular forms “a,” “an” and “the” are intended to include the plural forms as well, unless the context clearly indicates otherwise. Additionally, as used herein, the terms “comprises,” “comprising,” “includes” and/or “including” specify the presence of stated features, integers, steps, operations, elements, and/or components, but do not preclude the presence or addition of one or more other features, integers, steps, operations, elements, components, and/or groups thereof. Furthermore, as used herein, terms such as “right,” “left,” “vertical,” “horizontal,” “top,” “bottom,” “upper,” “lower,” “under,” “below,” “underlying,” “over,” “overlying,” “parallel,” “perpendicular,” etc., are intended to describe relative locations as they are oriented and illustrated in the drawings (unless otherwise indicated) and terms such as “touching,” “in direct contact,” “abutting,” “directly adjacent to,” “immediately adjacent to,” etc., are intended to indicate that at least one element physically contacts another element (without other elements separating the described elements). The term “laterally” is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a semiconductor layer having a first surface and a second surface opposite the first surface; and a device including:

a well region within the semiconductor layer, wherein the well region extends into the semiconductor layer to a first depth from the second surface;

at least one porous region of the semiconductor layer, wherein the at least one porous region of the semiconductor layer extends partially through the well region from the second surface to a second depth shallower than the first depth;

a drain region immediately adjacent to the well region; and a gate on the second surface partially overlaying the well region and completely horizontally offset from the at least one porous region, wherein at least a portion of the second surface from below the gate across the at least one porous region to the drain region is substantially planar and wherein the at least one porous region is laterally between and separated from the drain region and the gate.

2. The structure of claim 1, wherein the drain region is within the well region shallower in depth than the at least one porous region and above the semiconductor layer.

3. The structure of claim 1, wherein the at least one porous region includes a single porous region parallel to the drain region.

4. The structure of claim 1, wherein the at least one porous region includes multiple porous regions.

5. The structure of claim 4, wherein the multiple porous regions include at least two porous regions with different dimensions.

6. The structure of claim 1, wherein the drain region is above the semiconductor layer.

7. The structure of claim 1, wherein the device further includes an active device region and, at opposing ends of the active device region, the drain region and a source region.

8. The structure of claim 7, wherein the gate is on the semiconductor layer above the active device region positioned laterally between the source region and the drain region, wherein the at least one porous region is within the well region between the gate and the drain region, and wherein the device further includes:

a gate sidewall spacer above and immediately adjacent to the well region, horizontally between the gate and the at least one porous region, wherein a top surface of the well region below the gate sidewall spacer and a top surface of the at least one porous region are co-planar; and a dielectric layer above and immediately adjacent to the second surface, over the at least one porous region, and having opposite ends adjacent to the drain region and the gate sidewall spacer, respectively.

9. The structure of claim 8, wherein the gate is separated from the drain region by a first distance and from the source region by a second distance that is less than the first distance.

10. The structure of claim 7, wherein a lower portion of the semiconductor layer has a first type conductivity, wherein the well region has a second type conductivity that is different from the first type conductivity, and wherein the drain region and the source region have the second type conductivity at a higher conductivity level than the well region.

11. The structure of claim 10, wherein the device further includes an additional well region positioned laterally adjacent to the well region within the semiconductor layer, wherein the additional well region has the first type conductivity at a higher conductivity level than the lower portion of the semiconductor layer, and wherein the source region is immediately adjacent to the additional well region.

12. The structure of claim 1, wherein the semiconductor layer comprises silicon, and wherein the at least one porous region comprises a porous silicon.

13. A structure comprising:

a semiconductor layer having a first surface and a second surface opposite the first surface, wherein the semiconductor layer comprises silicon; and a device including:

an active device region in the semiconductor layer;

a well region in the active device region, wherein the well region extends into the semiconductor layer from the second surface to a first depth;

at least one porous region of the semiconductor layer, wherein the at least one porous region comprises porous silicon and extends partially through the well region from the second surface to a second depth shallower than the first depth;

at opposing ends of the active device region, a source region and a drain region, wherein the drain region is immediately adjacent to the well region and parallel to the at least one porous region;

a drain region immediately adjacent to the well region; and a gate on the second surface partially overlaying the well region and completely horizontally offset from the at least one porous region, wherein at least a portion of the second surface from below the gate across the at least one porous region to the drain region is substantially planar and wherein the at least one porous region is laterally between and separated from the drain region and the gate.

14. A method comprising:

providing a semiconductor layer having a first surface and a second surface opposite the first surface; and forming a device including: a well region within the semiconductor layer, wherein the well region extends into the semiconductor layer from the second surface to a first depth; at least one porous region of the semiconductor layer, wherein the at least one porous region extends through the well region from the second surface to a second depth shallower; and a gate on the second surface partially overlaying the well region and completely horizontally offset from the at least one porous region, wherein at least a portion of the second surface from below the gate across the at least one porous region to the drain region is substantially planar and wherein the at least one porous region is laterally between and separated from the drain region and the gate.

15. The method of claim 14, wherein the forming of the device includes:

forming at least one opening in a mask layer on the semiconductor layer; and performing an electrochemical etch process to form a porous region in each exposed region of the semiconductor layer at a bottom of each opening in the mask layer.

16. The method of claim 15, wherein the forming of the at least one opening includes forming a single opening and wherein the electrochemical etch process results in a single porous region in the semiconductor layer.

17. The method of claim 15, wherein the forming of the at least one opening includes forming multiple parallel openings and wherein the electrochemical etch process results in multiple parallel porous regions in the semiconductor layer.

18. The method of claim 14, wherein the forming of the at least one opening includes forming a pattern of openings and wherein the electrochemical etch process results in a pattern of porous regions in the semiconductor layer.

19. The method of claim 14, wherein the forming of the device includes:

forming the at least one porous region in an active device region in the semiconductor layer;

forming a gate on the semiconductor layer above the active device region offset from the at least one porous region;

forming the well region in the semiconductor layer so the at least one porous region is within the well region; and forming a drain region and a source region at opposite ends of the active device region, wherein the drain region is formed immediately adjacent to the well region so the at least one porous region is between the gate and the drain region and so the drain region is separated from the gate by a first distance, and wherein the source region and the drain region are formed so the gate is between the source region and the drain region and so the gate is separated from the source region by a second distance that is less than the first distance.

20. The method of claim 14, wherein the forming of the device further includes:

forming a gate sidewall spacer above and immediately adjacent to the well region, horizontally between the gate and the at least one porous region, wherein a top surface of the well region below the gate sidewall spacer and a top surface of the at least one porous region are co-planar;

forming a dielectric layer; and patterning the dielectric layer, wherein, after the patterning, the dielectric layer is above and immediately adjacent to the second surface, over the at least one porous region, and has opposite ends adjacent to the drain region and the gate sidewall spacer, respectively.

* * * * *